(12) United States Patent
Schenkel et al.

(10) Patent No.: US 12,384,683 B2
(45) Date of Patent: Aug. 12, 2025

(54) DOPANT-VACANCY CENTERS IN MATERIALS AND METHODS OF MAKING THEREOF

(71) Applicant: The Regents of The University of California, Oakland, CA (US)

(72) Inventors: Thomas Schenkel, San Francisco, CA (US); Arun Persaud, El Cerrito, CA (US); Edward Barnard, Berkeley, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 786 days.

(21) Appl. No.: 17/509,241

(22) Filed: Oct. 25, 2021

(65) Prior Publication Data

US 2022/0135409 A1  May 5, 2022

Related U.S. Application Data

(60) Provisional application No. 63/107,767, filed on Oct. 30, 2020.

(51) Int. Cl.
| | |
|---|---|
| *C01B 32/28* | (2017.01) |
| *B82Y 15/00* | (2011.01) |
| *B82Y 20/00* | (2011.01) |
| *B82Y 40/00* | (2011.01) |
| *C09K 11/65* | (2006.01) |
| *C30B 29/04* | (2006.01) |
| *C30B 33/04* | (2006.01) |
| *G02B 1/00* | (2006.01) |

(52) U.S. Cl.
CPC ............. *C01B 32/28* (2017.08); *C09K 11/65* (2013.01); *C30B 29/04* (2013.01); *C30B 33/04* (2013.01); *G02B 1/002* (2013.01); *B82Y 15/00* (2013.01); *B82Y 20/00* (2013.01); *B82Y 40/00* (2013.01); *C01P 2002/52* (2013.01); *C01P 2004/16* (2013.01)

(58) Field of Classification Search
None
See application file for complete search history.

(56) References Cited

FOREIGN PATENT DOCUMENTS

| | | | | |
|---|---|---|---|---|
| JP | 2000146781 A | * | 5/2000 | |
| JP | 5536056 B2 | * | 7/2014 | ............. B82Y 10/00 |
| WO | WO-2019239137 A1 | * | 12/2019 | ............. G01N 24/10 |

OTHER PUBLICATIONS

Schwartz et al. ("Local formation of nitrogen-vacancy centers in diamond by swift heavy ions," J. Appl. Phys. 116, 214107 (2014)).*
T. Schroder, et al., "Quantum nanophotonics in diamond [invited]," J. Opt. Soc. Am. B 33, B65-B83 (2016).
J. Meijer, et al., "Generation of single color centers by focused nitrogen implantation," Appl. Phys. Lett. 87, 261909 (2005).
(Continued)

*Primary Examiner* — Andrew Smyth

(57) ABSTRACT

This disclosure provides systems, methods, and apparatus related to color centers. In one aspect, a method includes providing diamond doped with a dopant. A heavy-ion is directed to the diamond that passes through the diamond. The heavy-ion forms a line of dopant-vacancy centers as it passes through the diamond.

17 Claims, 5 Drawing Sheets

(56) References Cited

OTHER PUBLICATIONS

J. Schwartz, et al., "Local formation of nitrogen-vacancy centers in diamond by swift heavy ions," J. Appl. Phys. 116, 214107 (2014).
F. C. Waldermann, et al., "Creating diamond color centers for quantum optical applications," Diamond Relat. Mater. 16, 1887-1895 (2007).
Z. Huang, et al., "Diamond nitrogen-vacancy centers created by scanning focused helium ion beam and annealing," Appl. Phys. Lett. 103, 081906 (2013).
V. M. Acosta, et al., "Diamonds with a high density of nitrogen-vacancy centers for magnetometry applications," Phys. Rev. B 80, 115202 (2009).
V. S. Varichenko, et al., "Luminescence of natural IIa diamond implanted with nitrogen ions," Phys. Status Solidi A 95, K25-K28 (1986).
P. Racke, et al., "Nanoscale ion implantation using focussed highly charged ions," New J. Phys. 22, 083028 (2020).
J. Schwartz, et al., "Effects of low-energy electron irradiation on formation of nitrogen-vacancy centers in single-crystal diamond," New J. Phys. 14, 043024 (2012).
S. Pezzagna, et al., "Creation efficiency of nitrogen-vacancy centres in diamond," New J. Phys. 12, 065017 (2010).
J. Botsoa, et al., "Optimal conditions for NV-center formation in type-1b diamond studied using photoluminescence and positron annihilation spectroscopies," Phys. Rev. B 84, 125209 (2011).
T. Luhmann, et al., "Coulomb-driven single defect engineering for scalable qubits and spin sensors in diamond," Nat. Commun. 10, 4956 (2019).
G. Chai, et al., "Electron transport through single carbon nanotubes," Appl. Phys. Lett. 91, 103101 (2007).
Russell E. Lake et al., "Direct formation of nitrogen-vacancy centers in nitrogen doped diamond along the trajectories of swift heavy ions," Appl. Phys. Lett. 118, 084002 (2021).

\* cited by examiner

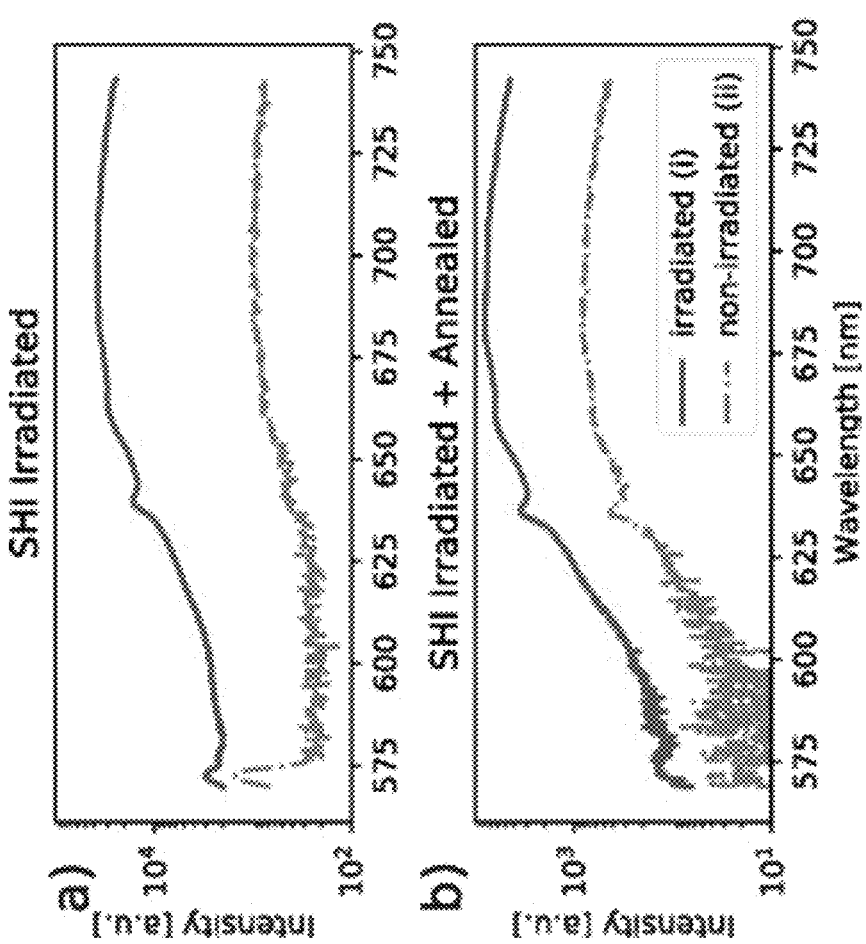
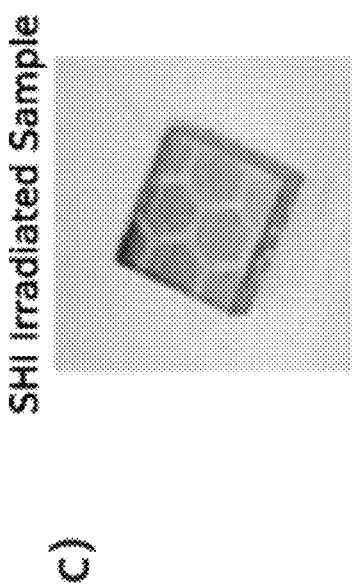
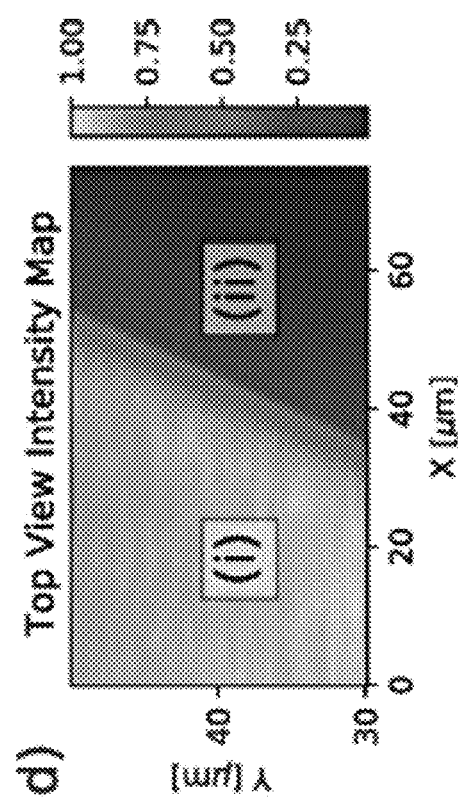
Figure 1A
Figure 1B
Figure 1C
Figure 1D

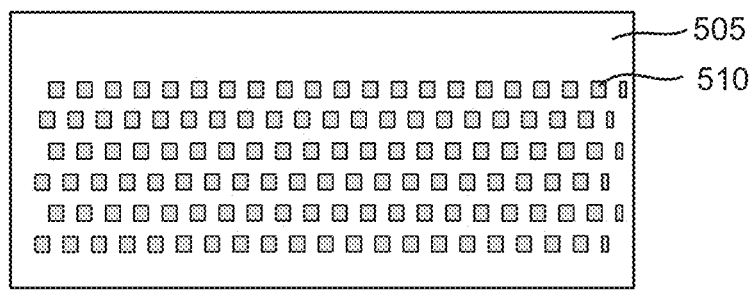
*FIG. 5A*
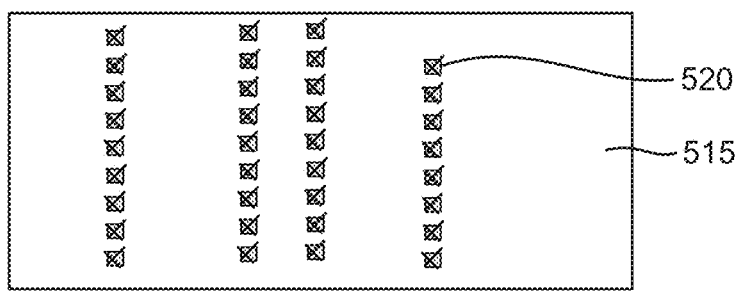
*FIG. 5B*
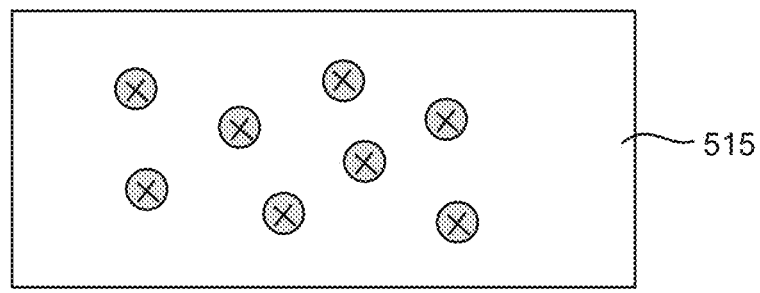
*FIG. 5C*
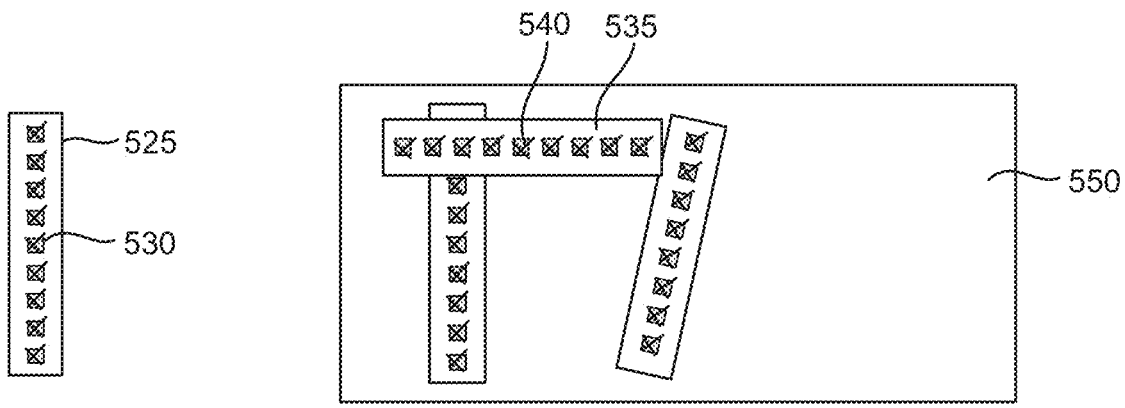
*FIG. 5D*     *FIG. 5E*

DOPANT-VACANCY CENTERS IN MATERIALS AND METHODS OF MAKING THEREOF

RELATED APPLICATIONS

This application claims priority to U.S. Provisional Patent Application No. 63/107,767, filed Oct. 30, 2020, which is herein incorporated by reference.

STATEMENT OF GOVERNMENT SUPPORT

This invention was made with government support under Contract No. DE-AC02-05CH11231 awarded by the U.S. Department of Energy. The government has certain rights in this invention.

TECHNICAL FIELD

This disclosure relates generally to color centers such as dopant-vacancy centers in materials and methods of making thereof.

BACKGROUND

The negatively charged nitrogen-vacancy ($NV^-$) defect center in diamond has gained much attention for applications in quantum optics due to its long coherence time at room temperature and its great potential for quantum sensing and quantum communication. Reliable formation of color centers with long spin coherence times and the placement of color centers into quantum registers are major challenges for applications. This is, in part, due to the fact that the understanding of the microscopic formation mechanisms of NV centers has remained incomplete. In particular, density functional theory apparently contradicts some experimental results. Studies of color center formation processes under a series of experimental conditions can help support advances toward the deterministic formation of high-quality color centers.

From the perspective of quantum device fabrication, it will be useful to place single color centers and arrays of aligned color centers into precise locations of a sample. This calls for modes of fabrication with high spatial resolution.

SUMMARY

Described herein is a method for forming quasi-1D strings of dopant-vacancy centers in diamond with up to about 10,000 dopant-vacancy centers over about 10 microns to 100 microns.

High-energy heavy-ions have a range of tens of microns in materials such as diamond. The heavy-ions travel in nearly straight lines. Along these paths, the heavy-ions can excite the diamond and directly form dopant-vacancy centers in diamond that has been doped with a dopant (e.g., nitrogen) during crystal growth. Other spin photon color centers can also be formed in diamond and in other materials, including silicon carbide.

In the Examples, we report depth-resolved photoluminescence measurements of nitrogen-vacancy ($NV^-$) centers formed along the tracks of swift heavy ions (SHIs) in type Ib synthetic single crystal diamonds that had been doped with 100 ppm nitrogen during crystal growth. Analysis of the spectra showed that $NV^-$ centers are formed preferentially within regions where electronic stopping processes dominate and not at the end of the ion range where elastic collisions lead to the formation of vacancies and defects. Thermal annealing further increased NV yields after irradiation with SHIs preferentially in regions with high vacancy densities. NV centers formed along the tracks of single swift heavy ions can be isolated with lift-out techniques for explorations of color center qubits in quasi-1D registers with an average qubit spacing of a few nanometers and of order 100 color centers per micrometer along about 10 μm to 100 μm long percolation chains.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

FIGS. 1A and 1B show photoluminescence spectra of SHI-irradiated diamond. FIG. 1A shows a spectra from the SHI-irradiated and FIG. 1B shows a later annealed sample. A photograph of the sample is shown in FIG. 1C where the lighter regions are pristine and dark regions are irradiated. In FIG. 1D, a normalized count rate intensity map at fixed depth shows contrast between irradiated (i) and pristine (ii) regions of the irradiated and annealed sample. Note: the absolute values in FIG. 1A cannot be directly compared to the results in FIG. 1B.

FIGS. 5A-5E show examples of illustrations of doped diamond and diamond including dopant-vacancy centers.

DETAILED DESCRIPTION

Figure 2:
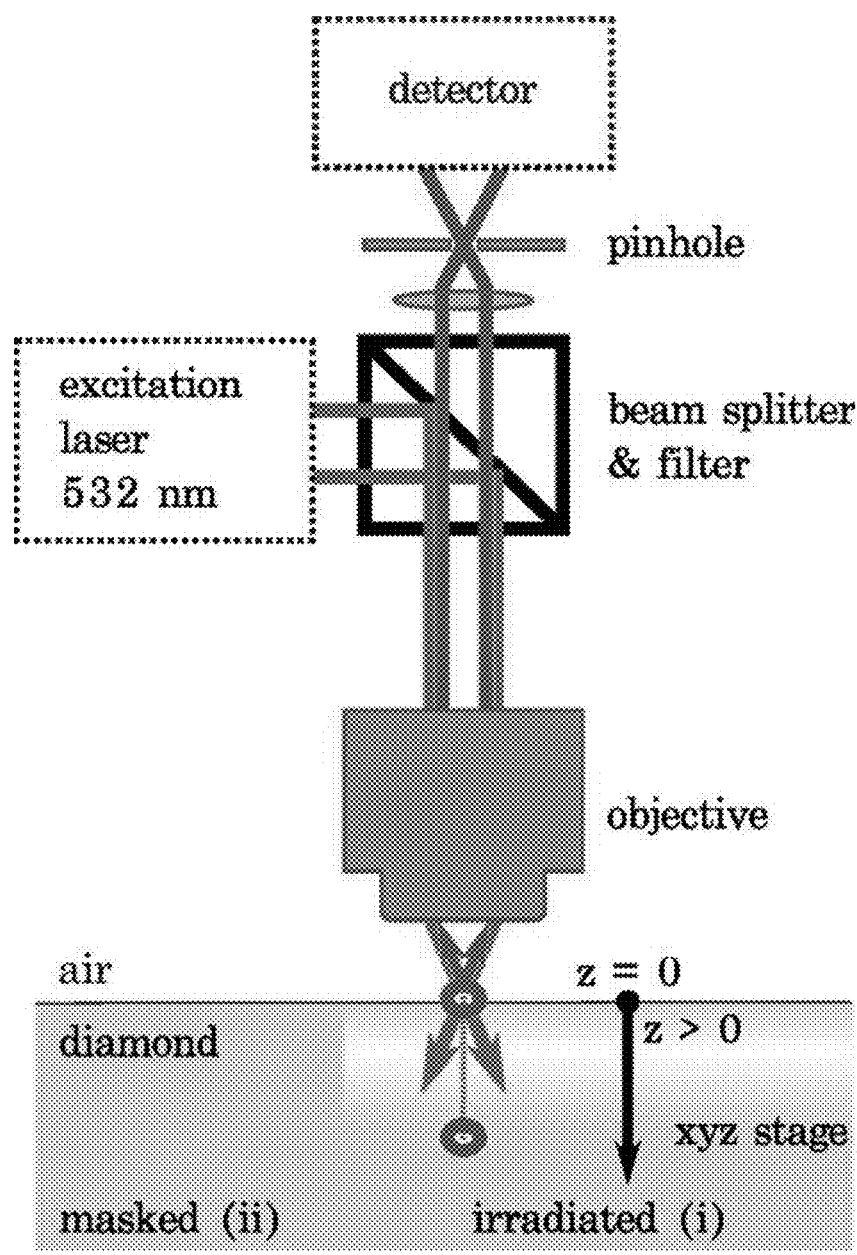
FIG. 2 shows a schematic diagram of the device used for three-dimensional photoluminescence measurements.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

The terms "about" or "approximate" and the like are synonymous and are used to indicate that the value modified by the term has an understood range associated with it, where the range can be ±20%, ±15%, ±10%, ±5%, or ±1%. The terms "substantially" and the like are used to indicate that a value is close to a targeted value, where close can mean, for example, the value is within 80% of the targeted value, within 85% of the targeted value, within 90% of the targeted value, within 95% of the targeted value, or within 99% of the targeted value.

A dopant-vacancy center is one of numerous point defects in diamond. When nitrogen is the dopant, the dopant-vacancy center is referred to as a nitrogen-vacancy center, or NV center. A NV center is a nearest-neighbor pair of a nitrogen atom, which substitutes for a carbon atom, and a lattice vacancy.

Color centers, such as nitrogen-vacancy centers in diamond (primarily in the negative charge state, but also the neutral NV center), are promising qubit candidates for quantum sensing, communication, and computing. Forming arrays of NV centers with spacings of about 5 nanometers to 10 nanometers has not been possible. This close spacing of NV centers is needed for nearest neighbor coupling and for the formation of percolation chains of coupled qubits for scaling of quantum operations. Embodiments described herein include a method for forming quasi-1D strings of dopant-vacancy color centers with up to about 10,000 dopant-vacancy color centers over about 10 microns and up to about 100 microns. Also, described herein is a method to form bars of a few thousand dopant-vacancy color centers that can be arranged to form larger networks.

High-energy heavy-ions have a range of tens of microns in materials such as diamond. The heavy-ions travel on nearly straight lines. Along these paths, the heavy-ions excite the diamond and directly form NV-color centers in diamond that has been doped with nitrogen during crystal growth. Other color centers can also be formed, including by doping diamond or other material with other elements during growth or with a pre-implant. In some embodiments, the diamond is randomly doped-diamond. A color center spacing of a few nanometers can be achieved with randomly doped-diamond.

Delta-doped diamond (i.e., diamond doped with delta-function-like profiles), with nitrogen-doped layers of about 0.5 nanometers to 2 nanometers thickness and layer spacings of about 5 nanometers to 10 nanometers, where many such layers can be formed, can be used instead of randomly doped-diamond. The nitrogen distribution is random in each layer.

When a heavy ion passes through nitrogen-doped diamond, it forms color centers that are aligned along the ion's path and with a spacing given by the layer spacing in the delta-doped diamond. The formation efficiency of N to NV per ion is not known, but it is estimated to be >10%. Specifying the N concentration in a layer, layer spacing, and ion species (e.g., about 1 GeV Au or about 5 GeV U) will enable design of desired color center strings.

Strings of NV centers can be isolated and lifted out of bulk diamond or membranes using nanotechnology methods (e.g., focused ion beam (FIB)). In some embodiments, a color center bar has dimensions of about 100 nanometers by 100 nanometers by 20 microns. In some embodiments, color center bars are placed on substrates and arranged for quantum information science (QIS) applications. Each color center string can contain on the order 1000 to 10,000 color centers. A color center bar can also act as a waveguide for photons emitted from color centers.

Figure 4:
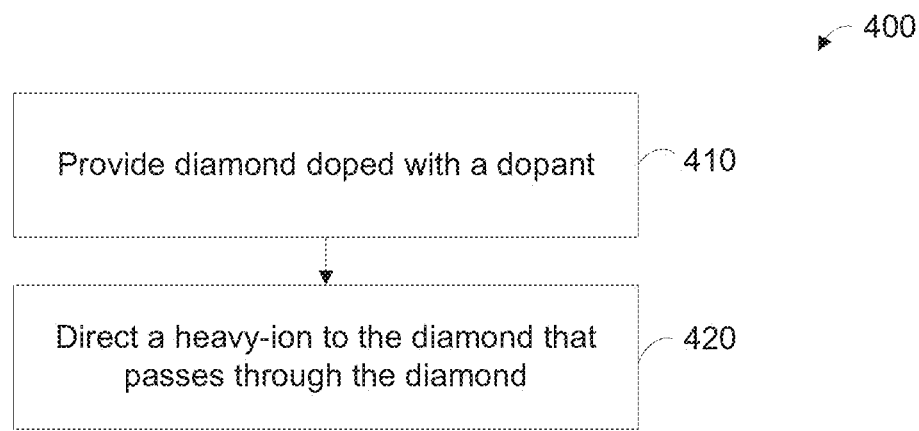
FIG. 4 shows an example of a flow diagram illustrating a process for forming dopant-vacancy centers in diamond.

FIG. 4 shows an example of a flow diagram illustration a process for forming dopant-vacancy centers in diamond. FIGS. 5A-5E show examples of illustrations of doped diamond and diamond including dopant-vacancy centers.

Starting at block 410 of the process 400 shown in FIG. 4, diamond doped with a dopant is provided. In some embodiments, the dopant is a dopant from the group of nitrogen, silicon, and germanium. For example, when the dopant is nitrogen, nitrogen-vacancy centers are formed in the diamond. In some embodiments, the diamond has dimensions of about 100 microns to 1000 microns by about 300 microns to 10,000 microns by about 300 microns to 10,000 microns.

In some embodiments, a distribution of the dopant in the diamond is random. The doping concentration is about $10^{18}$ $cm^{-3}$ to $10^{19}$ $cm^{-3}$.

In some embodiments, the diamond comprises delta-doped diamond. Delta-doping is a material growth technique (e.g., performed using metal organic chemical vapor deposition (MOCVD)) which can be used to generate thin layers of a material of high dopant concentration. Generally, the delta-doping procedure includes multiple growth steps. In some implementations, the host material (in this case diamond) source and the dopant source are opened intermittently. By doing this, thick nominally undoped layers of the host material can be grown that are interrupted by relatively thin layers of the host material with high dopant concentration. In some embodiments, the delta-doped diamond includes a plurality of layers that are doped with the dopant with diamond that is not doped being in between adjacent layers. In some embodiments, each layer (i.e., comprising doped diamond) of the plurality of layers is about 0.5 nanometers to 2 nanometers thick. In some embodiments, a spacing (i.e., comprising undoped diamond) between adjacent layers of the plurality of layers is about 5 nanometers to 20 nanometers. The doping concentration in each of the doped layers is about $10^{18}$ $cm^{-3}$ to $10^{20}$ $cm^{-3}$. In some embodiments, a distribution of the dopant in each of the layers is random. FIG. 5A shows an example of an illustration of delta-doped diamond. The diamond 505 includes a dopant 510. The dopant 510 in the diamond 505 forms layers of the dopant 510.

Returning to FIG. 4, at block 420, a heavy-ion is directed to the diamond and passes through the diamond. The heavy-ion forms a line of dopant-vacancy centers as it passes through the diamond.

In some embodiments, the heavy-ion is a Eu (Z=63) ion, an Au (Z=79) ion, or a U (Z=92) ion. In some embodiments, the heavy-ion is a Eu (Z=63) ion to a U (Z=92) ion. That is, in some embodiments, the heavy-ion is an ion of an element on the periodic table including Eu and U and between Eu and U. In some embodiments, the heavy-ion is a transuranic ion (i.e., an ion with an atomic number greater than 92). An example of a transuranic ion is a Cf (Z=98) ion. In some embodiments, an energy of the heavy-ion is about 0.5 GeV to 5 GeV. Any isotope and ion energy combination that produces straight ion tracks over longer distances can be used.

In some embodiments, the line of dopant-vacancy centers includes about 20 dopant-vacancy centers or more. In some embodiments, the line of dopant-vacancy centers includes about 100 dopant-vacancy centers to 10,000 dopant-vacancy centers, about 500 dopant-vacancy centers to 1500 dopant-vacancy centers, about 1000 dopant-vacancy centers, or about 10,000 dopant-vacancy centers. In some embodiments, the line of dopant-vacancy centers is about 0.1 microns to 100 microns long, about 5 microns to 100 microns long, about 5 microns to 15 microns long, about 10 microns long, or about 100 microns long. For example, a line of dopant-vacancy centers about 10 microns to 20 microns long could be generated with an about 1 GeV Au ion. As another example, a line of dopant-vacancy centers about 100 microns long could be generated with an about 5 GeV U ion.

In some embodiments, a spacing between adjacent dopant-vacancy centers is about 2 nanometers to 20 nanometers. In some embodiments, a spacing between adjacent dopant-vacancy centers is about 2 nanometers to 15 nanometers, or about 8 nanometers. These spacings may be generated when the distribution of the dopant in the diamond is random. In some embodiments, a spacing between adjacent dopant-vacancy centers is about 5 nanometers to 20 nanometers. These spacings may be generated when the diamond is delta-doped diamond.

FIGS. 5B and 5C show examples of illustrations of diamond doped with a dopant after a heavy-ion has been directed to the diamond and passes through the diamond. FIG. 5B is a side view (i.e., a view perpendicular to the path of the heavy-ion) and FIG. 5C is a top view (i.e., a view parallel to the path of the heavy-ion). As shown in FIGS. 5B and 5C, the heavy-ion forms dopant-vacancy centers 520 as it passes through the diamond 515. The dopant-vacancy centers are in a line along the path of a heavy-ion as it passes through the diamond 515.

In some embodiments, the process further includes removing a bar of the diamond, with the bar including a line of dopant-vacancy centers. In some embodiments, removing the bar is performed using a focused ion beam. In some embodiments, the bar has dimensions of about 50 nanometers to 150 nanometers by about 50 nanometers to 150 nanometers by about 10 microns to 100 microns. In some embodiments, the bar has dimensions of about 100 nanometers by about 100 nanometers by about 20 microns. In some embodiments, a spacing between adjacent dopant-vacancy centers is about 2 nanometers to 20 nanometers, about 5 nanometers to 20 nanometers, or about 2 nanometers to 15 nanometers. In some embodiments, the dopant-vacancy centers are nitrogen-vacancy centers.

FIG. 5D shows an example of an illustration of a bar of diamond 525 including a line of dopant-vacancy centers 530. FIG. 5E shows an example of an illustration of a plurality of bars of diamond 535 arranged on a substrate 550. Each of the plurality of bars of diamond includes a line of dopant-vacancy centers 540. Such an arrangement of bars of diamond 535 on the substrate 550 can be used for qubit experiments and other applications.

Dopant-vacancy centers can also be formed in materials other than diamond. For example, in some embodiments, a material doped with a dopant that can form dopant-vacancy centers in the material is provided. In some embodiments, the material comprises a high bandgap material. In some embodiments, the material comprises a 2D material (e.g., $MoS_2$ or $WS_2$). In some embodiments, the material is a material from the group of silicon (Si), silicon carbide (SiC), boron nitride (BN), and aluminum nitride (AlN). In some embodiments, the dopant is a dopant from the group of nitrogen, silicon, germanium, titanium, tin, lead, and erbium.

Then, a heavy-ion is directed to the material and passes through the material. The heavy-ion forms a line of dopant-vacancy centers as it passes through the material.

EXAMPLES

The following examples are intended to be examples of the embodiments disclosed herein, and are not intended to be limiting.

Here, we report on the formation of color centers in diamond along the trajectories of swift heavy ions (SHIs). SHIs, such as gold ions at 1.1 GeV, transverse solids along near straight lines over distances of tens of micrometers with high probability. We report that nitrogen-vacancy (NV) centers form in the interaction of SHIs with nitrogen-doped diamond directly, without any thermal annealing. In many earlier studies, energetic ions and electrons have been used to first form vacancies and then NV-centers in diamonds during a consecutive thermal annealing step. Hence, we observe an efficient one-step process for local color center formation with alignment of color centers along the trajectory of each SHI.

The motivation for this work was twofold. In addition to developing new fabrication tools for diamond-based quantum-photonic devices, we also sought to understand the role of intense electronic excitations in color center formation within the nonequilibrium process of track formation. Swift heavy ion tracks in diamond have recently been treated with computational methods. Efforts to engineer non-Poissonian spatial distributions of color centers in diamond have included, among others, the use of He ions, 60 keV N ions, highly charged Ar ions, and beams of energetic electrons in preimplanted diamond. NV center yields of up to about 50% have been reported, but much lower yields are common.

Recently, progress has been reported on achieving a higher NV center yield using ion implantation and local doping of diamonds. While higher color center yields have been reported, underlying mechanisms of competing color center processes remain to be disentangled and formation of spin-photon qubit registers with (sub-) 10 nm resolution as required for nearest neighbor coupled qubits with magnetic dipolar interaction remains a challenge.

The samples studied in this work were type Ib diamonds (Element Six) with approximately 100 ppm nitrogen present from chemical vapor deposition growth. During irradiation with swift heavy ions, the sample was masked by a thick metallic grid with millimeter-sized openings to allow for both irradiated and nonirradiated regions to be measured at the same time. Irradiations were carried out with 1.1 GeV $^{197}$Au ions. The irradiation was performed in high vacuum and nominal at room temperature with the sample mounted on an aluminum holder that also acted as a heat sink. Beam-induced macroscopic heating of the sample is estimated to stay well below 80° C., based on temperature monitoring using an infrared camera of similar sized carbon samples irradiated under the same beam conditions. The diamond was irradiated with a fluence of $1\times10^{12}$ ions/cm$^2$ using an ion beam flux of $6\times10^9$ ions/cm$^2$/s. Gold ions at these energies have a range of 34 μm in diamond. After irradiation, the mask was removed and contrast between the irradiated and nonirradiated regions was visible by eye (FIG. 1C), where the darker regions of the sample were irradiated and the lighter regions were masked.

Figures 3A, 3B, 3C, 3D:
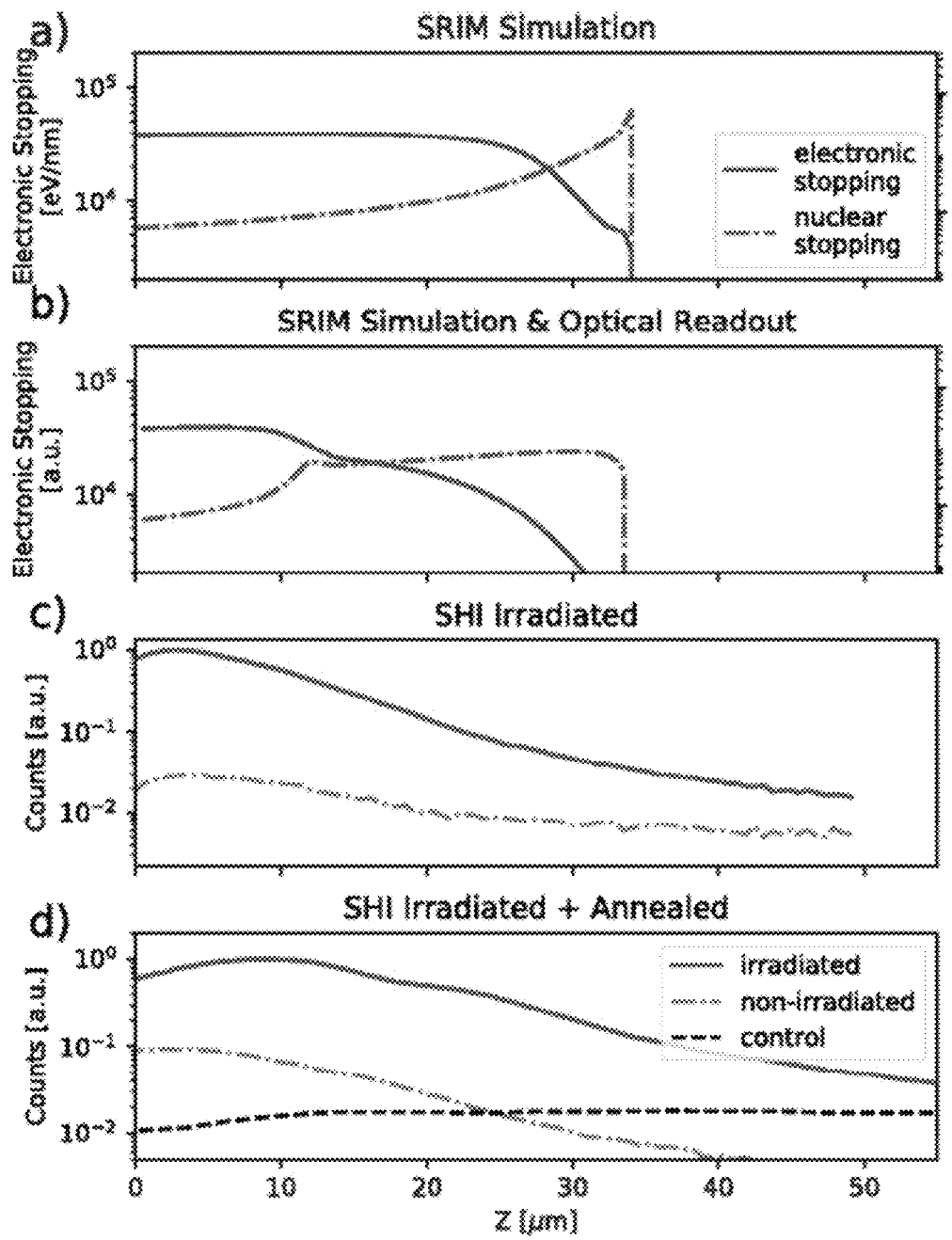
FIG. 3A shows the Stopping and Range of Ions in Matter (SRIM) simulation of 1.1 GeV Au ions into diamond showing contributions of the electronic and nuclear stopping processes along the ion paths.
FIG. 3B shows the SRIM data convoluted with depth-dependent probe volume.
FIG. 3C shows the depth profiles of the NV—peak for the SHI-irradiated sample.
FIG. 3D shows the depth profiles of the NV—peak after annealing the sample combined with a measurement from a control sample with a uniform NV— distribution. Note: the absolute values in FIG. 3D cannot be directly compared to the results in FIG. 3C.

We performed room temperature photoluminescence (PL) measurements across boundaries of the masked and irradiated regions. These measurements were performed with a custom built confocal PL setup designed for spatially resolved three dimensional maps of optically active defects in semiconductors (FIG. 2). The sample was mounted with adhesive tape on a glass slide and placed on a piezo-nanopositioning sample stage. Control experiments on a reference sample demonstrated that using this apparatus, we can collect PL signals from the NV⁻ defects at depths of >60 µm (FIG. 3D). Using the depth-resolved one-photon excitation-collection scheme, photoluminescence was collected through a pinhole and into detection optics. For spectral measurements, the excitation wavelength was 532 nm.

Initial measurements were performed after irradiating, and before annealing the sample, and are shown in FIGS. 1A and 1B. PL spectra were measured within the irradiated) and masked regions. The intensity of the PL is enhanced in the regions that were irradiated by the ions. Qualitatively similar spectra were observed after annealing the sample in high vacuum at 800° C. for one hour in FIG. 1B. The difference in PL intensity between irradiated and nonirradiated areas can also be clearly seen in the contrast of FIG. 1D, which shows an x-y map of the sample and the grey gradation represents the integrated measured PL spectra (normalized). The intensity of the PL spectra was measured in units of total photon counts per second within the wavelength span from 570 nm to 740 nm and is at least a factor of ten higher in the irradiated region compared to the nonirradiated region. We track the depth dependence of the spectral feature at a wavelength of $\lambda=637$ nm associated with the zero phonon line (ZPL) of NV⁻ centers using the experimental setup shown schematically in FIG. 2. In particular, we moved the x-y-z sample stage while keeping the excitation laser focus position constant. We can thus scan the sample stage position to collect the PL signal from a selected volume within the sample.

To locate the stage position where the laser focuses on the surface, we added a filter to remove the PL contribution and record only the z-dependent reflection signal. The stage position at maximum reflection is identified as the surface position z=0 and was used to calibrate the z axis in FIGS. 3A-3D.

As the stage moved toward the objective and the focus spot moves deeper into the sample, we recorded the PL spectrum for each location for 100 ms. To convert from the stage position coordinate to the actual depth where the diamond was optically excited, we multiply the stage position by the index of refraction in diamond, n=2.4, as $z=n\, z_{stage}$. Although the stage has nanometer resolution, the depth resolution is given by light excitation and collection volumes, which are stretched due to the high index of refraction of diamond. Using Eq. (1) from N. J. Everall, "Confocal Raman microscopy: Why the depth resolution and spatial accuracy can be much worse than you think," Appl. Spectrosc. 54, 1515-1520 (2000), we found that in our measurements, where we used a 100× lens with a numerical aperture (NA) of 0.95, the resolution scales proportionally to $4.6\, z_{stage}$ as we excite deeper in the sample.

To analyze the data, we averaged the spatial regions to achieve better signal-to-noise spectra for the irradiated vs nonirradiated region (FIGS. 1A and 1B) or integrate just the NV peak at a wavelength of $\lambda=637$ nm from 630 nm to 645 nm and the lateral spatial dimension to obtain the depth distribution of the NV centers as shown in FIGS. 3A-3D.

FIG. 3A-3D show the depth profiles of the integrated PL around the NV⁻ ZPL line for the areas irradiated to SHI radiation and the nonirradiated control regions. Data from each panel are normalized to the maximum intensity measured in the irradiated region. In FIG. 3A, the results from Stopping and Range of Ions in Matter (SRIM) are shown. In FIG. 3B, we assume that NV centers are produced exclusively by either electronic or nuclear stopping and calculate the expected response by folding the simulated data from FIG. 3A with the estimated probe volume. For the SHI-irradiated sample in FIG. 3C, we observe an increase in intensity within the irradiated region between the surface and a depth of approximately 5 µm followed by a drop in intensity. The nonirradiated region of the sample shows a much weaker signal with a similar profile (possible due to light scattering). After the sample was annealed, we observe a similar characteristic profile with an additional shoulder at a larger depth (20 µm-35 µm). The anneal also activates the NV center in the nonirradiated regions although at a much lower intensity level. The measurements in FIGS. 1A, 1B, 3C, and 3D were taken at different times and due to parameter changes in the confocal microscope, one cannot directly compare absolute numbers between these figures (irradiated and nonirradiated data in each subplot can be compared though). Furthermore, note that the purpose of the control sample shown in FIG. 3D is to verify that we can acquire a NV signal below the end-of-range depth of the SHI, but the amplitudes cannot be compared to the data from the irradiated diamond sample, because of the unknown NV concentration in the samples.

Using a diamond with a uniform distribution of nitrogen, we observe that NV centers are created by SHIs. The observed depth profile agrees well with the profile of the electronic stopping once we take the changes in probed volume into account. We also observe no peak in the NV center density that can be contributed directly to the end-of-range peak of nuclear stopping of the SHIs in diamond (simulated using SKIM). We attribute the difference between the irradiated and nonirradiated signals in FIG. 3C at a depth larger than the range of the SHI to light collection from out of focus areas, e.g., from NV centers at a shallower depth. We also note that a standard anneal of the sample only creates a small fraction of the NV centers the SHIs created. After annealing the sample, we observe additional NV centers at the end-of-range of the ions where most of the vacancies are created. Therefore, we conclude that although vacancies are needed for the NV formation, the availability of vacancies alone is not enough to create NV centers and that energy deposition due to electronic stopping or ion recoils also plays an important role in effectively creating NV centers.

We estimate the self-absorption of the emitted light by the NV centers by using an absorption cross section of $\sigma=2.8\times 10^{-17}$ cm² and a density of $d=1.76\times 10^{19}$ cm⁻³ (equivalent to 100 ppm and 100% activation) and calculating the transmission $T=\exp(-l\sigma d)$, where l is the length of the photon path. This results in a transmission larger than 98% at a depth of 40 µm. We, therefore, can ignore the effect of self-absorption.

The observed NV⁻ distribution does seem to follow the electronic energy loss of the SHI closely. A possible explanation could be that this is due to the role of secondary electrons (or delta-electrons) that can be formed in close collisions of the SHI with target electrons. Electrons with energies up to 10 keV can be formed in collisions with 1 GeV gold ions, well below the threshold for vacancy formation of 120 keV. Electrons can contribute in several ways to creating NV centers, for example, by heating and locally annealing the volume around the SHI track. Detailed energy-loss and energy transport simulations and further experiments are ongoing. Another reason for a decrease in the NV⁻ signal near the end of range of the gold ions could be the formation of other defects, for example, vacancy clusters, which could lower the PL signal.

The primary effect of thermal annealing is the activation of NV centers due to the initial nitrogen concentration in the samples (irradiated and nonirradiated areas). Furthermore, in the SHI-irradiated regions, the annealing causes a broadening of the intensity-depth distribution due to diffusion and an increased activation near the end-of-range of the ions that we attribute to the additional vacancies that are available in this region (20 μm-35 μm). By considering the difference in intensity between the irradiated and nonirradiated spectra of FIG. 3D, we observe that the 800° C. anneal does not reproduce the effect of SHI radiation exposure. Specifically, the intensity of the NV$^-$ peak is approximately 50 times higher in the irradiated region than in the non-irradiated-annealed region before annealing. Measurements of quantitative changes in NV$^-$ population due to ion irradiation (with and without annealing) are still in progress.

From the increase in the SHI-induced NV$^-$ intensities compared to nonirradiated regions in our annealed diamond, we can estimate a NV$^-$ conversion efficiency of SHIs. First, we observe that the intensity of the irradiated region is roughly 8× larger than in the nonirradiated region. Assuming a nitrogen-to-NV$^-$ conversion factor, p, during the anneal, a depth-independent conversion factor, q, from the SHI, and a total number of available nitrogen, A, we can calculate the number of NV$^-$ centers in the nonirradiated, annealed region to be Ap and in the irradiated region to be Aq+A(1−q)p (assuming we do not lose NV$^-$ centers from SHIs during the anneal). The ratio, r, of the SHI conversion factor and the annealing conversion factor can then be expressed as r=(g+(1−q)p)/p. This results in a SHI conversion factor of q=(r−1)(p/(1−p). J. R. Rabeau, P. Reichart, G. Tamanyan, D. N. Jamieson, S. Prawer, F. Jelezko, T. Gaebel, I. Popa, M. Domhan, and J. Wrachtrup, "Implantation of labelled single nitrogen-vacancy centers in diamond using 15N," Appl. Phys. Lett. 88, 023113 (2006), report a conversion factor using a similar anneal as we do of p=2.5%, which would result in a conversion factor for the SHI between 15% and 20%. However, this is only a rough estimate of NV$^-$ formation yield from the SHI, ignoring, for example, its depth dependence. Future experiments will include the measurement of the activation by annealing (p) and improved depth-measurements allowing a better estimate of the NV$^-$ conversion factor for SHIs.

SHIs transverse diamond samples on almost straight lines, with effective interaction track diameters of a few nanometers radius and trajectory lengths of tens of micrometers. NV centers, hence, form along a quasi-1D chain. The apparent density of NV centers in SHI-irradiated areas is about 50× higher than in nonirradiated regions. Their average spacing will be given by the concentration and distribution of the nitrogen (present mostly as P1 centers) following single crystal growth together with the NV-formation efficiency per SHI. Thermal annealing will broaden the distribution due to defect diffusion processes. 1D chains of NV centers from low fluence irradiations (e.g., 1×10$^6$ ions/cm$^2$) can be isolated from bulk samples using common lift-out techniques (see, e.g., G. Chai, H. Heinrich, L. Chow, and T. Schenkel, "Electron transport through single carbon nanotubes," Appl. Phys. Lett. 91, 103101 (2007)), and they can then be integrated, for example, with microwave sources and magnetic fields for exploration of spin-photon qubits with nearest neighbor coupling along a percolation chain. We plan to perform lift-out of NV chains created by SHI irradiation in future experiments. Using the estimated NV conversion efficiency of 15%-20% and the N density of 100 ppm, 1.1 GeV gold ions form NV centers with an average spacing of a few nanometers over a distance of over ten micrometers in a quasi-1D register with potentially over one thousand qubits. A high nitrogen background concentration stabilizes NV-center charge states, but the nitrogen spin bath will also limit spin coherence times to a few microseconds at room temperature.

CONCLUSION

Described herein is a method for forming a color center spin register with about 1000 to 10,000 dopant-vacancy color centers. The dopant-vacancy color centers are aligned along a line. The background doping (e.g., nitrogen doping) of the material in which the color centers are being formed might limit coherence times to a few microseconds at room temperature. The background doping will also stabilize the charge state of negatively charged dopant-vacancy centers. It may be possible to increase this coherence length with a combination of magnetic fields (e.g., magic angles in magnetic dipolar coupling) and by cooling.

These color center strings can be used in quantum sensing applications, for example, to sense small magnetic fields with high spatial resolution. The color center strings can be placed on arbitrary surfaces for integration, including into bio-environments. The color center strings can be integrated for quantum computing applications with now thousands of coupled qubits. The color center stings can enable scaling of quantum communication with quantum memories.

Further details regarding the embodiments described herein can be found in R. E. Lake et al., "Direct formation of nitrogen-vacancy centers in nitrogen doped diamond along the trajectories of swift heavy ions," Appl. Phys. Lett. 118, 084002 (2021), which is herein incorporated by reference.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

What is claimed is:

1. A method comprising:
providing diamond, a plurality of layers of the diamond being delta-doped with a dopant, each layer of the plurality of layers being about 0.5 nanometers to 2 nanometers thick, and a spacing between adjacent layers of the plurality of layers being about 5 nanometers to 20 nanometers; and
directing a heavy-ion to the diamond that passes through the diamond, the heavy-ion forming a line of dopant-vacancy centers in the plurality of layers of the diamond as it passes through the diamond, a spacing between adjacent dopant-vacancy centers being about 5 nanometers to 20 nanometers.

2. The method of claim 1, wherein the dopant is a dopant from the group of nitrogen, silicon, and germanium.

3. The method of claim 1, wherein the heavy-ion is an ion of an element having an atomic number Z, wherein 63 (Eu)<Z<92 (U), or wherein the heavy-ion is a transuranic ion.

4. The method of claim 1, wherein an energy of the heavy-ion is about 0.5 GeV to 5 GeV.

5. The method of claim 1, wherein the line of dopant-vacancy centers includes about 100 dopant-vacancy centers to 10,000 dopant-vacancy centers.

6. The method of claim 1, wherein the line of dopant-vacancy centers is about 0.1 microns to 100 microns long.

7. The method of claim 1, wherein a distribution of the dopant in each of the layers is random.

8. The method of claim 1, further comprising:
removing a bar of the diamond, the bar including the line of dopant-vacancy centers.

9. The method of claim 8, wherein the removing is performed using a focused ion beam.

10. The method of claim 8, wherein the bar has dimensions of about 50 nanometers to 150 nanometers by about 50 nanometers to 150 nanometers by about 10 microns to 100 microns.

11. The method of claim 8, wherein the bar has dimensions of about 100 nanometers by about 100 nanometers by about 20 microns.

12. The method of claim 1, wherein a concentration of the dopant in each of the layers is about $10^{18}$ cm$^{-3}$ to $10^{20}$ cm$^{-3}$.

13. A method comprising:
providing a material, the material being a material from a group of diamond, silicon, silicon carbide, boron nitride, and aluminum nitride, a plurality of layers of the material being delta-doped with a dopant, each layer of the plurality of layers being about 0.5 nanometers to 2 nanometers thick, and a spacing between adjacent layers of the plurality of layers being about 5 nanometers to 20 nanometers; and
directing a heavy-ion to the material that passes through the material, the heavy-ion forming a line of dopant-vacancy centers in the plurality of layers of the material as it passes through the material, a spacing between adjacent dopant-vacancy centers being about 5 nanometers to 20 nanometers.

14. The method of claim 13, wherein the dopant is a dopant from the group of nitrogen, silicon, and germanium.

15. The method of claim 13, wherein the heavy-ion is an ion of an element having an atomic number Z, wherein 63 (Eu)<Z<92 (U), or wherein the heavy-ion is a transuranic ion.

16. The method of claim 13, wherein an energy of the heavy-ion is about 0.5 GeV to 5 GeV.

17. The method of claim 13, wherein a concentration of the dopant in each of the layers is about $10^{18}$ cm$^{-3}$ to $10^{20}$ cm$^{-3}$.

* * * * *